United States Patent [19]

Nath et al.

[11] Patent Number: 4,537,795
[45] Date of Patent: Aug. 27, 1985

[54] METHOD FOR INTRODUCING SWEEP GASES INTO A GLOW DISCHARGE DEPOSITION APPARATUS

[75] Inventors: Prem Nath, Rochester; Kevin R. Hoffman, Sterling Heights; Timothy D. Laarman, Almont, all of Mich.

[73] Assignee: Sovonics Solar Systems, Solon, Ohio

[21] Appl. No.: 637,358

[22] Filed: Aug. 3, 1984

Related U.S. Application Data

[63] Continuation of Ser. No. 418,929, Sep. 16, 1982, abandoned.

[51] Int. Cl.³ .......................................... H01L 21/365
[52] U.S. Cl. ....................................... 427/39; 427/85; 427/74; 427/255.5; 427/255.1; 118/723; 118/50.1; 118/718; 118/719; 118/733
[58] Field of Search ............... 118/718, 719, 723, 733, 118/50.1; 427/255.7, 255.5, 85, 255.2, 255.1, 74, 38, 39; 277/3, 53, 80; 34/242

[56] References Cited

U.S. PATENT DOCUMENTS

| | | | |
|---|---|---|---|
| 4,048,955 | 9/1977 | Anderson | 118/719 |
| 4,438,724 | 3/1984 | Doehler et al. | 118/719 |
| 4,462,332 | 7/1984 | Nath et al. | 118/900 X |
| 4,492,181 | 1/1985 | Orshinsky et al. | 118/718 |

Primary Examiner—Norman Morgenstern
Assistant Examiner—Bernard F. Plantz

[57] ABSTRACT

A method for introducing sweep gas through a baffle system adapted for use with glow discharge deposition apparatus in which successive amorphous semiconductor layers are deposited on a substrate. The deposition apparatus includes at least a pair of adjacent dedicated deposition chambers into each of which different process gases are introduced, the chambers being operatively connected by a gas gate. Inert gases are swept through the gas gate to minimize back diffusion of process gases from the chambers. The baffle system is adapted to prevent said sweep gases from entering into turbulent flow when traveling through the gas gate passageway. Further, a sufficient volume per unit time of sweep gas is introduced to insure that some sweep gas flows into the cathode region of the first chamber, thereby substantially preventing process gases and plasma from escaping from the cathode region and forming silane powder.

1 Claim, 5 Drawing Figures

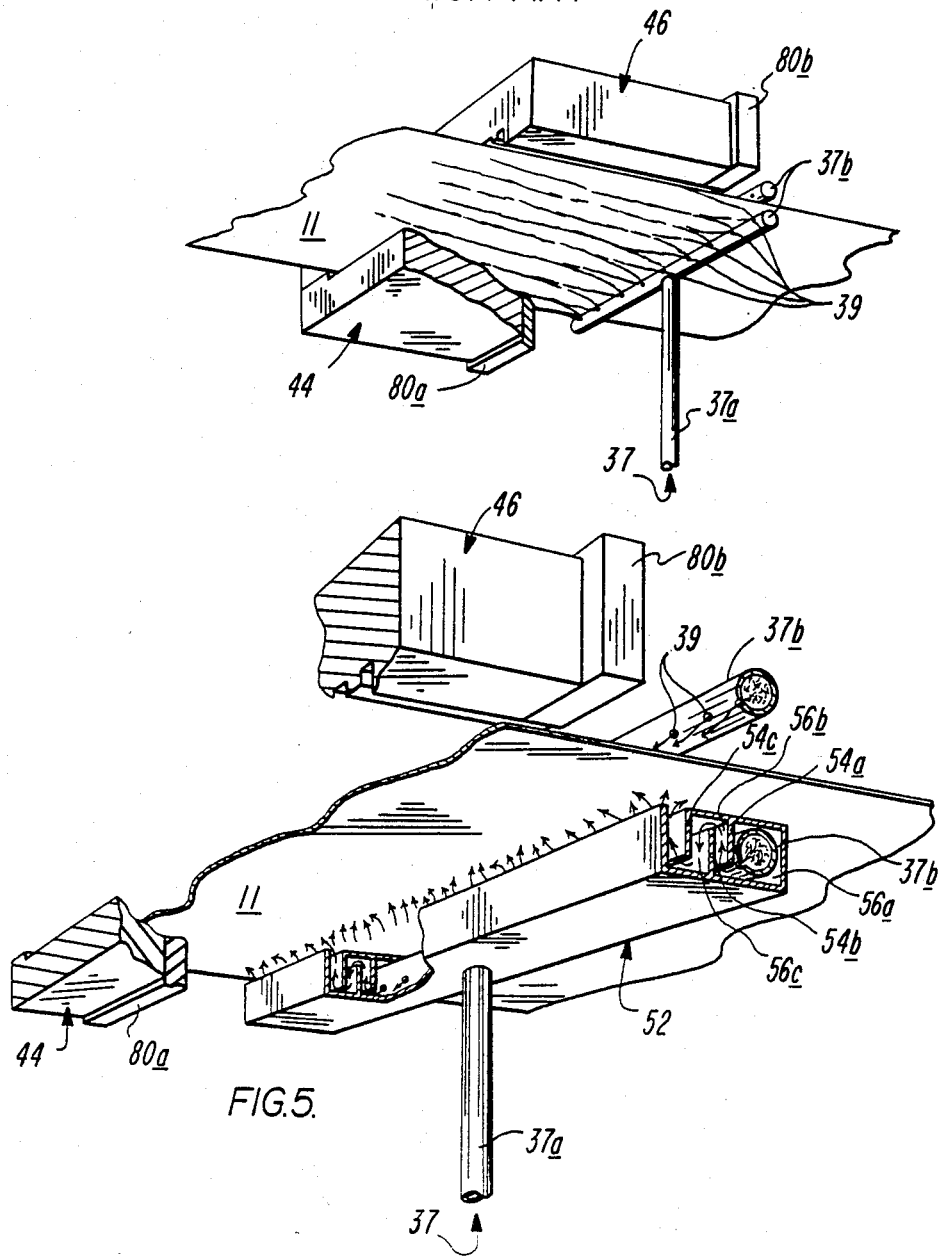

METHOD FOR INTRODUCING SWEEP GASES INTO A GLOW DISCHARGE DEPOSITION APPARATUS

This is a continuation of application Ser. No. 418,929 filed Sept. 16, 1982 now abandoned.

FIELD OF THE INVENTION

This invention relates generally to apparatus for producing improved photovoltaic devices and more particularly to a sweep gas introduction system for: (1) substantially reducing turbulent flow of the sweep gases through the gas gate passageway; and (2) substantially preventing silane powder from being deposited onto a substrate, the powder formed when unused process gases or plasma contact a wall of a deposition chamber.

BACKGROUND OF THE INVENTION

This invention relates to apparatus for continuously producing photovoltaic devices on a substrate by depositing successive amorphous-silicon alloy semiconductor layers in each of at least two adjacent deposition chambers. The composition of each amorphous layer is dependent upon the particular process gases introduced into each of the deposition chambers. The gases introduced into the first deposition chamber are carefully controlled and isolated from the gases introduced into the adjacent deposition chamber. More particularly, the deposition chambers are operatively connected by a relatively narrow gas gate passageway (1) through which the web of substrate material passes; and (2) which is adapted to isolate the process gases introduced into the first chamber from the process gases introduced into the adjacent deposition chamber. As is well known in the art, despite the relatively small size of the gas gate passageways, a percentage of gases introduced into one chamber still back diffuse into the adjacent chamber, thereby contaminating the layer deposited in said adjacent chamber. In an effort to further reduce back diffusion of process gases, prior art gas gates have incorporated supply conduits at the high pressure side of the gas gates for introducing inert gases adapted to flow, at high velocities, through the gas gate passageway. While the use of the inert sweep gases was beneficial in further reducing back diffusion through the gas gate passageway, the high rate of speed with which they traveled therethrough often produced turbulent flow patterns which tended to partially increase the back flow or back diffusion of process gases, thereby reducing the efficiency of photovoltaic devices produced therefrom.

Further, although each deposition chamber includes an evacuation port adjacent the plasma region thereof for withdrawing unused process gases and nondeposited plasma, not all of the process gases and plasma can be withdrawn therethrough before they contact a wall of the deposition chamber. Process gases and plasma which contact a chamber wall form a silane powder which adheres to the semiconductor layer deposited onto the substrate. The formation of powder between layers of a semiconductor device can severely harm or destroy the efficiency of that device.

The present invention operates to: (1) substantially reduce the turbulent flow of sweep gases through the gas gate passageway; and (2) reduce the formation of powder between semiconductor layers caused by unused process gases and nondeposited plasma contacting the walls of a deposition chamber.

Recently, considerable efforts have been made to develop systems for depositing amorphous semiconductor alloys, each of which can encompass relatively large areas, and which can be doped to form p-type and n-type materials for the production of p-i-n-type devices which are, in operation, substantially equivalent to their crystalline counterparts.

It is now possible to prepare amorphous silicon alloys by glow discharge techniques which possess (1) acceptable concentrations of localized states in the energy gaps thereof, and (2) high quality electronic properties. Such a technique is fully described in U.S. Pat. No. 4,226,898, entitled Amorphous Semiconductors Equivalent to Crystalline Semiconductors, Stanford R. Ovshinsky And Arun Madan which issued Oct. 7, 1980; and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by smaller band gap materials to absorb the light passed through the first cell. By substantially matching the generated currents from each cell, the overall open circuit voltages from each cell may be added, thereby making the greatest use of light energy passing through the semiconductor device.

It is of obvious commercial importance to be able to mass produce photovoltaic devices. Unlike crystalline silicon which is limited to batch processing for the manufacture of solar cells, amorphous silicon alloys can be deposited in multiple layers over large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the back diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

While the combination of (1) establishing a substantially unidirectional flow of gases from the intrinsic deposition chamber to adjacent dopant chambers through a small gas gate passageway; (2) reducing the size of those passageways by employing magnetic assemblies which urge the unlayered substrate surface toward one of the passageway walls; and (3) directing inert sweep gases from the high pressure side to the low pressure side of the gas gate serve to substantially reduce back diffusion of dopant process gases through the gas gate passageway and hence reduce contamination of the intrinsic semiconductor layers, it has been discovered that the velocity of the inert sweep gases flowing through the passageway must be carefully controlled to maintain the flow in a laminar state. Should the flow become turbulent, it becomes impossible to calculate the degree of back diffusion of process gases and the rate of back diffusion may actually increase. It is therefore one object of the present invention to provide apparatus which will prevent the flow of sweep gases through the gas gate passageway from becoming turbulent.

The plasma region of a deposition chamber is defined as the region between the cathode and the substrate wherein process gases are disassociated into the plasma which is then adapted to be deposited onto the substrate. The process gases are introduced into the deposition chamber adjacent the plasma region, are pulled across the top surface of the cathode and are withdrawn, along with the nondeposited plasma, through a port located at the underside of the cathode. By introducing and withdrawing the process gases and plasma adjacent the plasma region, an attempt was made by prior art apparatus to prevent the process gases and plasma from contacting the walls of the deposition chamber. However, it has been determined that not all of the process gases and plasma are immediately withdrawn. The result is that the process gases and plasma which are not immediately withdrawn are free to escape from the plasma region and contact the walls of the deposition chamber. The process gases and plasma contacting the deposition chamber walls form a silane powder which can settle between semiconductor layers deposited on the substrate. The powder either seriously impairs or shorts out a photovoltaic device produced from the semiconductor layers (particularly when the powder forms in the intrinsic deposition chamber between the p and n semiconductor layers). It is therefore another object of the present invention to flow inert sweep gases into the intrinsic deposition chamber to substantially prevent unused process gases and nondeposited plasma from contacting the walls of the chamber.

BRIEF SUMMARY OF THE INVENTION

Disclosed herein is a baffle system adapted to substantially eliminate the turbulent flow of inert sweep gases through the gas gate passageway, thereby preventing an increase in the back diffusion of process gases. The deposition apparatus includes at least two isolated deposition chambers operatively connected by a gas gate which is adapted to channel a unidirectional flow of gases from one to the adjacent chamber of each pair of deposition chambers.

The gas gate includes a relatively narrow passageway through which a substrate moves from the first of the adjacent deposition chambers wherein process gases deposit a first amorphous semiconductor layer thereonto, to the second of said deposition chambers wherein a differing set of process gases deposit a second amorphous semiconductor layer atop the first layer. The second deposition chamber is further provided with a conduit at the entrance of the gas gate passageway for introducing inert sweep gases such as hydrogen and argon. The inert gases are adapted to travel through the gas gate passageway at relatively high velocities so as to substantially prevent the back diffusion of process gases from the first deposition chamber to the adjacent deposition chamber. The baffle system described and claimed herein substantially includes a series of staggered baffle plates about which the inert sweep gases must circuitously flow prior to entering the gas gate passageway, thereby insuring that back diffusion of process gases does not increase due to turbulent flow of the inert sweep gases. By maintaining a laminar flow of sweep gases, the problem of back diffusion is controlled.

Also disclosed herein is apparatus for reducing the formation of silane powder which occurs when process gases and plasma are permitted to contact the walls of a deposition chamber. In practice, about 250 SCCM of inert sweep gases are introduced at the entry of the gas gate passageway. Approximately 215 SCCM of the inert sweep gases are directed toward and drawn into the dopant deposition chamber to prevent back diffusion of gases from the dopant chamber. The remaining 35 SCCM enter the intrinsic deposition chamber wherein the sweep gases are drawn into the plasma region, thereby preventing the unused process gases and nondeposited plasma in that plasma region from exiting from that region. In this manner the process gases and plasma are substantially prevented from contacting deposition chamber walls and forming silane powder.

These and other objects and advantages of the present invention will become clear from the drawings, the claims and the detailed description of the invention which follow.

BRIEF DESCRIPTION OF THE DRAWINGS

FIG. 4 is an enlarged, fragmentary perspective view illustrating the high speed flow of inert sweep gases exiting from prior art supply conduits;

FIG. 5 is a further enlarged, fragmentary perspective view illustrating the baffle system of the present invention operatively connected to the sweep gas supply conduit.

DETAILED DESCRIPTION OF THE DRAWINGS

I. The Photovoltaic Cell

Figure 1:
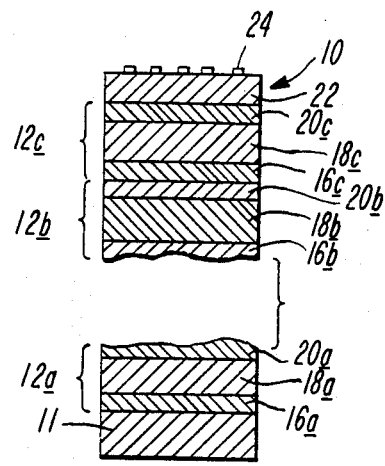
FIG. 1 is a fragmentary, cross-sectional view of a tandem photovoltaic device comprising a plurality of p-i-n type cells, each layer of the cells formed from an amorphous, semiconductor alloy.

Referring now to the drawings and particularly to FIG. 1, a photovoltaic cell, formed of a plurality of successive p-i-n layers, each of which includes an amorphous semiconductor alloy, is shown generally by the numeral 10. It is for the production of this type of photovoltaic device, wherein amorphous alloy layers are continuously deposited onto a moving substrate in successive isolated deposition chambers, that the baffle apparatus of the present invention was developed.

More particularly, FIG. 1 shows a p-i-n-type photovoltaic device such as a solar cell made up of individual p-i-n-type cells 12a, 12b and 12c. Below the lowermost cell 12a is a substrate 11 which may be transparent or formed from a metallic material such as stainless steel, aluminum, tantalum, molybdenum or chrome. Although certain applications may require a thin oxide layer and/or a series of base contacts prior to application of the amorphous material, for purposes of this application, the term "substrate" shall include not only a flexible film, but also any elements added thereto by preliminary processing.

Each of the cells 12a, 12b and 12c are fabricated with an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the baffle apparatus of this invention may also be used with apparatus adapted to produce single or multiple n-i-p cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II. The Multiple Glow Discharge Deposition Chambers

Figure 2:
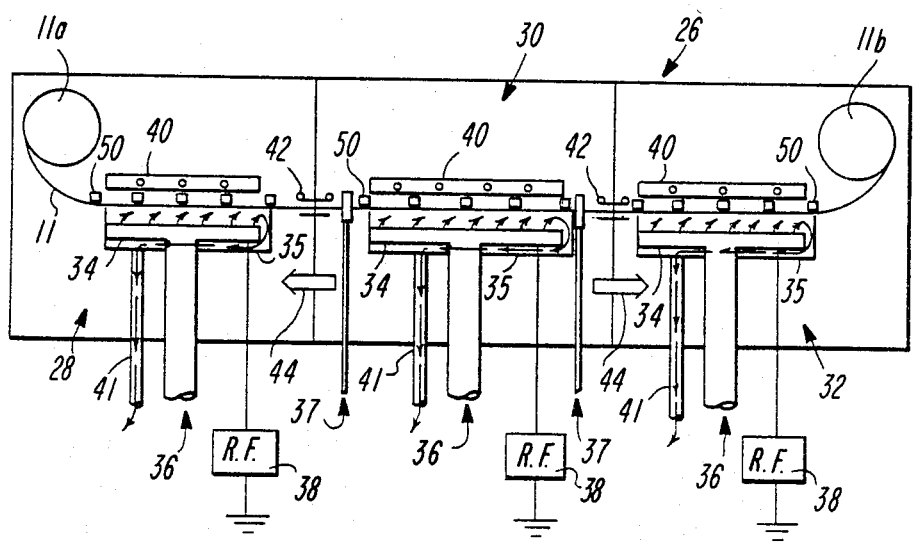
FIG. 2 is a diagrammatic representation of a multiple glow discharge chamber deposition system adapted for use in the continuous production of photovoltaic devices such as the cells shown in FIG. 1.

Turning now to FIG. 2, a diagrammatic representation of a multiple glow discharge chamber deposition apparatus for the continuous production of photovoltaic cells is generally illustrated by the reference numberal 26. The apparatus 26 includes a plurality of isolated, dedicated deposition chambers, each chamber of which is interconnected by a gas gate through which (1) sweep gases, (2) process gases, and (3) a web of substrate material are adapted to unidirectionally pass.

The apparatus 26 is adapted to mass produce large area, amorphous photovoltaic cells having a p-i-n configuration on the deposition surface of a substrate material 11 which is continually fed therethrough. To deposit the amorphous alloy layers required for producing multiple p-i-n-type layer cells, the apparatus 26 includes at least one triad of deposition chambers. Each triad of deposition chamber comprises: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough. It should be apparent that, (1) although, only one triad of deposition chambers has been illustrated, additional triads or additional individual chambers may be added to the apparatus to provide the machine with the capability of producing photovoltaic cells having any number of amorphous p-i-n-type layers; (2) the baffle apparatus of the present invention is applicable to any machine having isolated chambers separated by a gas gate to prevent the back diffusion of gases between those chambers; (3) the substrate supply core 11a and the substrate take-up core 11b are shown in the deposition chambers for illustrative purposes only, while in reality the cores would be housed in separate chambers operatively connected to the deposition chambers; and (4) although the glow discharge illustrated herein employes cathode with r.f. power, other glow discharge techniques, such as microwave frequencies, may be employed without departing from the spirit of the present invention.

Each deposition chamber 28, 30 and 32 of the triad is adapted to deposit a single amorphous silicon alloy, by glow discharge deposition onto the magnetic substrate 11. To that end, each of the deposition chambers 28, 30 and 32 includes: a cathode 34; a shield 35 disposed about each of the cathodes 34; a process gas supply conduit 36; an inert sweep gas conduit 37 disposed on opposed sides of the intrinsic deposition chamber; a radio frequency generator 18; a process gas and plasma evacuation conduit 41; a plurality of transversely extending magnetic elements 50; a plurality of radiant heating elements shown schematically as 40 in FIG. 2; and a gas gate 42 operatively connecting the intrinsic deposition chamber to each of the dopant chambers.

The supply conduits 36 are operatively associated with the respective cathodes 34 to deliver process gas mixtures to the plasma regions created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The radio frequency generators 38 operate in conjunction with the cathodes 34, the radiant heaters 40 and the grounded substrate 11 to form the plasma by disassociating the elemental reaction gases entering the deposition chambers into deposition species. The deposition species are then deposited onto the bottom surface of the substrate 11 as amorphous semiconductor layers. The substrate 11 is maintained substantially flat by the plurality of rows of magnetic elements 50 which provide an attractive force urging the substrate upwardly, out of its normal sagging path of travel.

To form the photovoltaic cell 10 illustrated in FIG. 1, a p-type amorphous silicon layer is deposited onto the substrate 11 in the deposition chamber 28, an intrinsic amorphous silicon alloy layer is deposited atop the p-type layer in the deposition chamber 30 and an n-type amorphous silicon alloy layer is deposited atop the intrinsic layer in the deposition chamber 32. As a result, the apparatus 26, deposits at least three amorphous silicon alloy layers onto the substrate 11 wherein the intrinsic layer deposited in deposition chamber 30 differs in composition from the layers deposited in deposition chambers 28 and 32 by the absence of at least one element which will be referred to as the dopant or doping species.

It is important that each of the alloy layers and particularly the intrinsic layer deposited onto a surface of the magnetic substrate 11 be of high purity in order to produce high efficiency photovoltaic devices 10. It is therefore necessary to substantially prevent the back diffusion of process gases from the dopant chambers into the intinsic deposition chamber. It is also necessary to substantially prevent unused process gases and nondeposited plasma from leaving the plasma region and contacting the chamber walls or risk the deposition of a silane powder film between semiconductor layers.

III. Prior Art Back Diffusion Limiting Techniques

Prior art devices constructed by the assignee herein, in an effort to prevent back diffusion and thereby isolate the intrinsic process gases in the intrinsic deposition chamber 30 from the dopant process gases in the dopant deposition chambers 28 and 32, established unidirectional flows, in the direction of arrows 44, of gases from that intrinsic deposition chamber into the dopant deposition chambers. As is apparent from FIG. 2, the intrinsic deposition chamber 30 is in operative communication with the dopant deposition chambers 28 and 32 by gas gates which are schematically illustrated therein as slots 42. The gas gates 42 are dimensioned to permit the substrate 11 to travel through a passageway 43 therein as the substrate continuously moves from the supply core 11a, through the deposition chambers to the take-up core 11b. The dimensional height of the gas gate passageway 43 is selected to be as small as possible to prevent back diffusion of the dopant process gases, while still being sufficiently large for the layered substrate to pass therethrough without contacting and being scratched by one of the surfaces of the passageway 43. U.S. patent application Ser. No. 372,937, filed May 7, 1982 and entitled "Magnetic Gas Gate" is examplary of such a design. Prior art devices have also attempted to reduce back diffusion by directing an inert gas such as argon through the gas gate passageway at very high velocities. While the use of sweep gases successfully reduces back diffusion when the flow of sweep gases is laminar, if the flow becomes turbulent, back diffusion may actually increase. One aspect of the present invention is directed to an improvement in the apparatus for directing the inert sweep gas through the gas gate passageway, the improvement adapted to prevent turbulent flow of sweep gases through the passageway. Another aspect of the present invention concerns the novel concept of purposefully directing a percentage of sweep gas exiting from the sweep gas conduit into the intrinsic chamber. As will be described hereinafter, this substantially prevents process gases and plasma from leaving the cathode region, contacting the walls of the deposition chamber and forming silane powder which will then settle between the semiconductor layers deposited on the substrate.

In order to prevent back diffusion, a unidirectional flow of sweep gases from the intrinsic deposition chamber to the dopant chambers through the gas gates 42 is established by maintaining the dopant chambers at a lower internal pressure than the intrinsic deposition chamber. To that end, each deposition chamber may be provided with automatic throttle valves, pumps, and manometers (not illustrated). Each throttle valve is operatively connected to a respective deposition chamber and to a respective pump so as to evacuate excess and spent deposition constituents from the deposition chambers. Each absolute manometer is operatively connected to a respective deposition chamber and a respective one of the throttle valves for controlling the pressure within said deposition chambers. Hence, a constant pressure differential is established and maintained between adjacent chambers.

In an attempt to confine the unused process gases and nondeposited plasma to the cathode region (the cathode region being defined herein as that area bounded by the substrate 11 and the shield 35) prior devices provided an evacuation conduit 41 in each cathode region of the deposition chambers. The evacuation conduits 41 were adapted to withdraw the process gases and plasma before they could contact the walls of the chambers and form silane powder.

Figure 3:
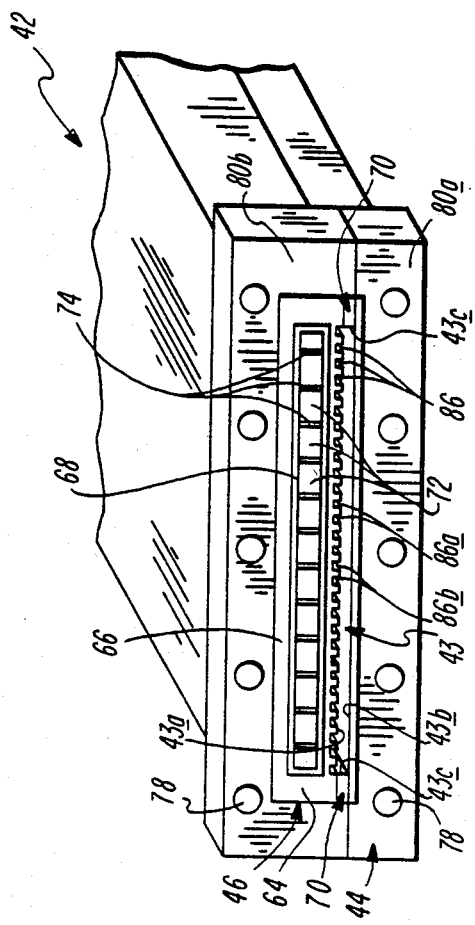
FIG. 3 is an enlarged, fragmentary perspective view of a grooved magnetic gas gate employed to substantially reduce back diffusion of gases from one to the other of adjacent deposition chambers.

Referring now to FIG. 3, a grooved, magnetic gas gate 42 is illustrated. The gas gate 42 includes a lower block 44 and an upper block 46. The relatively narrow passageway 43 therethrough is formed between the top surface of the lower gas gate block 44 and a cut-out portion or recess 64 in the upper gas gate block 46. It is through this passageway 43 that the unidirectional flow of the inert sweep gases from the intrinsic deposition chamber into the adjacent dopant chambers is established. It should be noted that, while it is most desirable to evacuate all process gases and plasma from the evacuation conduit disposed in the cathode region, in practice, some of the process gases and plasma are able to escape and migrate toward the gas gate passageway 43.

The gas gate passageway 43 is defined by an upper wall 43a, a lower wall 43b opposite the upper wall, and opposed side walls 43c. The magnetic assembly of the gas gate, described hereinafter, is secured within the recess 64 in the upper block 46 and is adapted to urge the substrate 11 into sliding contact with the upper gas gate passageway wall 43a. More particularly, an aluminum plate 66 and a stainless steel enclosure 68 are successively placed into the recess 64. A pair of elongated, relatively thin spacers 70 operate to both form the side walls 43c of the passageway 43 and fix the size of the passageway opening. Inside the stainless steel enclosure 68, a plurality of ceramic magnetics 72 are arranged in a plurality of rows and columns by a plurality of substantially flat, elongated, nonmagnetic separators 74.

The top surface of the lower block 44 of the gas gate 42 forms the lower wall 43b of the passageway 43. The lower block 44 and the upper block 46 are provided with a plurality of through-apertures 78 in attachment plates 80a and 80b, respectively, for mounting the gas gate 42 between adjacent deposition chambers. Further, a port (not shown) provides access into the upper block 64 and the aluminum plate 66 to establish communication with the recess 64 so that the recess can be pumped after the magnetic apparatus is inserted thereinto.

The web of substrate material 11 divides the magnetic gas gate passageway opening 43 into a relatively narrow upper slit and a relatively wide lower slit. In order for the inherently viscous inert gases to be swept through the relatively narrow, upper slit (bounded by the web of substrate material 11 and the upper wall 43a of the gas gate passageway 43) with sufficient velocity to inhibit or substantially prevent the back diffusion of process gases from a dopant chamber into the intrinsic chamber, a plurality of elongated, generally parallel grooves 86 are formed in the upper wall 43a of the gas gate passageway 43. The grooves 86 extend the entire, approximately eight inch, length of the gas gate passageway 43 so as to operatively communicate at one end with the dopant deposition chamber and at the other end with the intrinsic deposition chamber. Each of the parallel grooves 86 is defined by opposed side walls 86a and an upper wall 86b.

IV. The Sweep Gas Flow And The Baffle System

In the preferred embodiment of the present invention, gases or combinations of gases such as hydrogen, argon or other inert gas mixtures are introduced, under pressure, at the intrinsic chamber side of the gas gate 42. More particularly, these inert "sweep" gases are directed to flow from the supply conduits 37, disposed on the intrinsic chamber side of the gas gate 42, predominantly through the gas gate passageway 43 to the dopant chamber side of the gas gate. The qualification of "predominantly" is necessary because, despite (1) the presence of the pressure differential drawing the sweep gases toward the dopant chamber side of the gas gate 42 and (2) the high velocity at which the sweep gases enter the gas gate passageway 43, sufficient amounts (about 250 SCCM) of sweep gas are introduced to insure that about 35 SCCM of the sweep gas flows from each supply conduit 37 into the cathode region of the intrinsic chamber (a total of about 70 SCCM).

Referring specifically to FIGS. 4 and 5, each of the supply conduits 37 is shown as being formed by a substantially upright pipe 37a and a generally horizontally disposed, apertured pipe 37b. It should be apparent, however, that the supply of gases could be directed into the apparatus through a side chamber wall or top chamber wall rather than through the bottom walls illustrated herein. Irrespective of the disposition of the pipe 37a, the apertured pipe 37b will preferably (1) be orientated in a plane parallel to the plane of the substrate 11 and (2) extend substantially across the entire transverse width of the gas gate passageway 43. The horizontally disposed pipe 37b has a plurality of apertures 39 spaced along the transverse length thereof through which the sweep gases exit and enter, at substantial velocities, either the gas gate passageway 43 or the intrinsic deposition chamber.

As previously described, the high velocity of the sweep gases as they exit from the conduit 37 may cause said sweep gases to begin turbulent flow which can actually increase back diffusion of process gases from the dopant chamber. In order to substantially eliminate turbulent sweep gas flow, the horizontally-disposed, apertured pipe 37b is housed within a baffle manifold, generally referred to by the reference numeral 52. The manifold 52 is an elongated member, generally rectangular in cross-sectional configuration, and is adapted to be secured within the intrinsic deposition chamber so that the sweep gases exit therefrom adjacent the gas gate passageway 43. The manifold 52 is divided into a plurality of interconnected chambers 56a–56c by a plurality of elongated, staggered baffle plates 54a–54c which extend across the transverse length of the substrate 11. More particularly, the horizontally disposed pipe 37a is housed within elongated baffle chamber 56a, so that sweep gases expelled therefrom must traverse a circuitous path of travel about baffle plate 54a, through baffle chamber 56b, about baffle plate 54b, through baffle chamber 56c and about baffle plate 54c prior to entering the gas gate passageway and contacting the semiconductor layers. In this manner, laminar sweep gas flow is insured.

Dimensionally, the baffle manifold 52 is approximately one-half ($\frac{1}{2}$) inches wide, two-and-one half ($2\frac{1}{2}$) inches wide and fifteen (15) inches deep. The top surface of the manifold 52 is spaced one-eight ($\frac{1}{8}$) inches below the substrate 11. The apertures 39 in the horizontally disposed pipe 39 are approximately 30 mils in diameter and are spaced about every threequarters ($\frac{3}{4}$) inches. Approximately 215 SCCM of sweep gas flows into each dopant deposition chamber and approximately 70 SCCM of sweep gas flows into the intrinsic deposition chamber. A laminar flow rate of 215 SCCM of the sweep gases through the gas gate passageway is sufficient to substantially prevent the back diffusion of dopant process gases into the intrinsic chamber and a laminar flow rate of 70 SCCM of the sweep gases into the intrinsic chamber is sufficient to substantially prevent process gases and plasma not evacuated adjacent the cathode region from contacting the walls of the intrinsic chamber and forming silane powder.

More particularly (and referring, by way of example, specifically to the intrinsic deposition chamber 30) process gases are introduced into the cathode region of the intrinsic deposition chamber via supply conduit 36. By (1) introducing the process gases adjacent the upper surface of the cathode 34, (2) disposing the evacuation conduit adjacent the under surface of the cathode, (3) maintaining the evacuation conduit at lower pressure than the cathode region, and (4) positioning a shield 35 about the cathode region, the process gases are substantially confined within the cathode region of the intrinsic chamber 30.

However, the shield 35 is unable to completely isolate the cathode region of the intrinsic chamber from the remainder of the intrinsic chamber without abutting the layered surface of the substrate which forms the upper boundary of the cathode region. Therefore, process gases introduced into the cathode region of the intrinsic chamber are also pulled toward the gas gate passageway 43, the pressure in which is maintained so as to establish the unidirectional flow of sweep gases from the intrinsic to the dopant deposition chambers. If the process gases are permitted to escape from the cathode region, they are likely to contact the walls of the intrinsic deposition chamber as they migrate toward the gas gates. And should the process gases contact the chamber walls, silane powder will be formed which will likely be deposited atop the intrinsic semiconductor layer as the web of substrate material 11 passes between through the deposition chamber.

In order to prevent the process gases from contacting the walls of the deposition chamber and forming silane powder, approximately 250 SCCM of inert sweep gases are introduced to the intrinsic deposition chamber 30 via each of the sweep gas conduits 37. Since only about 215 SCCM may be removed through each of the gas gate passageways 43, the remaining approximately 35 SCCM of sweep gases from each of the conduits 37 have no alternative but to flow into the cathode region of the deposition chamber and exit along with unused process gases and nondeposited plasma via the evacuation conduit 41. Because the sweep gases establish a unidirectional flow into the cathode region, unused process gases and nondeposited plasma are substantially unable to escape from that cathode region. In this manner, the harmful formation of silane powder that occurs when process gases and plasma escape from the cathode region and contact walls of the chamber is substantially prevented.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

We claim:

1. An improved method for the glow discharge deposition of semiconductor material utilizing apparatus adapted to operate at sub-atmospheric pressure, said apparatus including at least two adjacent deposition chambers operatively interconnected by a gas gate passageway, each of the chambers including (1) a plasma region wherein semiconductor precursor process gases are introduced for disassociation into an ionized plasma and deposition as layers of semiconductor material onto a substrate, the process gases introduced into the first chamber differing from the process gases introduced into the second chamber by the addition of at least one element; and (2) means for withdrawing the unused process gases and non-deposited plasma from adjacent the respective plasma region of each chamber; the improved method including the steps of:

providing an introducing means, operatively disposed adjacent the gas gate passageway in the second one of said chambers, for directing a flow of said sweep gases across both the layered and unlayered surfaces of the substrate as the substrate passes through the gas gate passageway from the first toward the second chamber;

assuring that the flow of sweep gases across both the layered and unlayered surfaces of the substrate is of a sufficient velocity to substantially prevent back diffusion of said at least one element from the first to the second chamber;

providing means for effecting the substantially laminar flow of sweep gases traveling through the gas gate passageway; and, introducing a sufficient volumetric flow of sweep gases such that a portion of said introduced flow is directed so as to substantially prevent unused process gases and nondeposited plasma from leaving the plasma region of the second of the chambers.

* * * * *